United States Patent
Sharma et al.

(10) Patent No.: US 12,416,530 B2
(45) Date of Patent: Sep. 16, 2025

(54) TEMPERATURE DETECTION USING NEGATIVE TEMPERATURE COEFFICIENT RESISTOR IN GaN SETTING

(71) Applicant: GlobalFoundries U.S. Inc., Malta, NY (US)

(72) Inventors: Santosh Sharma, Austin, TX (US); Michael J. Zierak, Colchester, VT (US); Steven J. Bentley, Menands, NY (US); Johnatan Avraham Kantarovsky, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 592 days.

(21) Appl. No.: 17/931,670

(22) Filed: Sep. 13, 2022

(65) Prior Publication Data
US 2024/0085247 A1    Mar. 14, 2024

(51) Int. Cl.
*G01K 7/18* (2006.01)
*H01C 7/04* (2006.01)
(Continued)

(52) U.S. Cl.
CPC ............. *G01K 7/183* (2013.01); *H01C 7/041* (2013.01); *H10D 30/475* (2025.01);
(Continued)

(58) Field of Classification Search
CPC .. G01K 7/183; H01D 62/8503; H01D 62/824; H01D 84/01; H01D 64/111; H01D 30/475; H01C 7/041
See application file for complete search history.

(56) References Cited

U.S. PATENT DOCUMENTS

| | | |
|---|---|---|
| 7,145,201 B2 | 12/2006 | Pfirsch |
| 10,819,102 B2 | 10/2020 | Mayell |

(Continued)

OTHER PUBLICATIONS

Arakawa et al., "High hole mobility p-type GaN with low residual hydrogen concentration prepared by pulsed sputtering," Applied Materials, 4:086103, 2016, 6 pages.

(Continued)

*Primary Examiner* — Randy W Gibson
(74) *Attorney, Agent, or Firm* — Francois Pagette; Hoffman Warnick LLC

(57) ABSTRACT

A structure includes a negative temperature coefficient (NTC) resistor for use in gallium nitride (GaN) technology. The NTC resistor includes a p-type doped GaN (pGaN) layer, and a gallium nitride (GaN) heterojunction structure under the pGaN layer. The GaN heterojunction structure includes a barrier layer and a channel layer. An isolation region extends across an interface of the barrier layer and the channel layer, and a first metal electrode is on the pGaN layer spaced from a second metal electrode on the pGaN layer. The NTC resistor can be used as a temperature compensated reference in a structure providing a temperature detection circuit. The temperature detection circuit includes an enhancement mode HEMT sharing parts with the NTC resistor and includes temperature independent current sources including depletion mode HEMTs.

21 Claims, 7 Drawing Sheets

(51) Int. Cl.
*H10D 30/47* (2025.01)
*H10D 62/824* (2025.01)
*H10D 62/85* (2025.01)
*H10D 64/00* (2025.01)
*H10D 84/01* (2025.01)

(52) U.S. Cl.
CPC ....... *H10D 62/824* (2025.01); *H10D 62/8503* (2025.01); *H10D 64/111* (2025.01); *H10D 84/01* (2025.01)

(56) References Cited

U.S. PATENT DOCUMENTS

| | | |
|---|---|---|
| 11,276,680 B2 | 3/2022 | Pedone et al. |
| 2005/0194635 A1 | 9/2005 | Pfirsch |
| 2014/0120630 A1 | 5/2014 | Ren et al. |
| 2015/0270254 A1 | 9/2015 | Risbud |
| 2016/0133620 A1 | 5/2016 | Pedone et al. |
| 2022/0052166 A1* | 2/2022 | Yeh ...................... H10D 30/015 |
| 2023/0217569 A1* | 7/2023 | New ...................... H05B 45/18 315/309 |

OTHER PUBLICATIONS

Basler et al., "Building Blocks for GaN Power Integration," IEEE Access, 9:163122-37, 2021, 16 pages.
Lee et al., "GaN thin films as gas sensors," Sensors and Actuators B 6989, 2003, 7 pages.

* cited by examiner

TEMPERATURE DETECTION USING NEGATIVE TEMPERATURE COEFFICIENT RESISTOR IN GaN SETTING

BACKGROUND

The present disclosure relates to integrated circuits and, more particularly, to embodiments of a negative temperature coefficient (NTC) resistor and a related high-temperature detection circuit including the NTC resistor in a gallium nitride technology setting.

Gallium nitride high electron mobility transistors (GaN HEMTs) are used in power conversion circuits. As such these circuits require a way of detecting when the device temperature reaches a certain value as it is conducting current (due to conduction losses) so appropriate action can be taken, such as turning off the transistor gate to prevent thermal runaway. The temperature detection circuit needs to be co-integrated with the GaN power device on the same substrate so that the temperature signal accurately represents the condition of the GaN power device. However, temperature sensors are challenging to generate in GaN technology because negative temperature coefficient (NTC) resistors that are temperature dependent is not generally available in GaN technology.

SUMMARY

All aspects, examples and features mentioned below can be combined in any technically possible way.

An aspect of the disclosure provides a structure, comprising: a negative temperature coefficient (NTC) resistor including: a p-type doped gallium nitride (pGaN) layer; a gallium nitride (GaN) heterojunction structure under the pGaN layer, the GaN heterojunction structure including a barrier layer and a channel layer; an isolation region extending across an interface of the barrier layer and the channel layer; and a first metal electrode on the pGaN layer spaced from a second metal electrode on the pGaN layer.

An aspect of the disclosure includes a structure, comprising: a first temperature independent current source; a second temperature independent current source; an enhancement mode high electron mobility transistor (EM HEMT) having a gate, a first source/drain region and a second source/drain region; a negative temperature coefficient (NTC) resistor including a first metal electrode and a second metal electrode; a first node coupling the first temperature independent current source, the first metal electrode of the NTC resistor and the gate of the EM HEMT; a second node coupling the first source/drain region of the EM HEMT and the second metal electrode of the NTC resistor to ground; and an output node coupling the second source/drain region of the EM HEMT and the second temperature independent current source.

An aspect of the disclosure includes a structure, comprising: a first temperature independent current source and a second temperature independent current source, wherein the first temperature independent current source and the second temperature independent current source each include a depletion mode HEMT (DM HEMT) having a gate, a first source/drain region and a second source/drain region, and a zero-temperature coefficient (ZTC) resistor coupled between the first source/drain region and the gate of the DM HEMT, wherein the second source/drain region of the DM HEMT is coupled to a voltage source; an enhancement mode high electron mobility transistor (EM HEMT) having a gate, a first source/drain region and a second source/drain region; a negative temperature coefficient (NTC) resistor including a first metal electrode and a second metal electrode; a first node coupling the first temperature independent current source, the first metal electrode of the NTC resistor and the gate of the EM HEMT; a second node coupling the first source/drain region of the EM HEMT and the second metal electrode of the NTC resistor to ground; an output node coupling the second source/drain region of the EM HEMT and the second temperature independent current source; and wherein in response to a temperature crossing a threshold, a voltage change at the NTC resistor and at the gate of EM HEMT causes the EM HEMT to change states.

Another aspect of the disclosure includes a negative temperature coefficient (NTC) resistor, comprising: a p-type doped gallium nitride (pGaN) layer; a gallium nitride (GaN) heterojunction structure under the pGaN layer, the GaN heterojunction structure including a barrier layer and a channel layer; an isolation region extending across an interface of the barrier layer and the channel layer; and a first metal electrode on the pGaN layer spaced from a second metal electrode on the pGaN layer.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
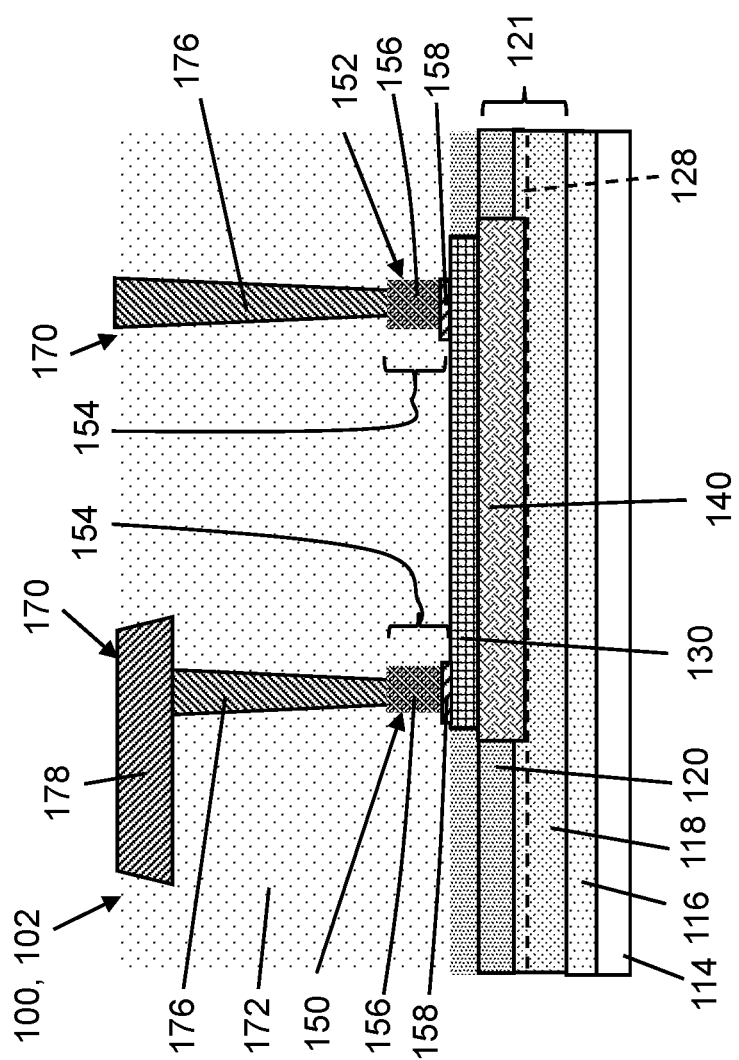
FIG. 1 shows a cross-sectional view of a structure including a negative temperature coefficient (NTC) resistor in a gallium nitride (GaN) technology setting, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a negative temperature coefficient (NTC) resistor for use in gallium nitride (GaN) technology. The NTC resistor includes a p-type doped GaN (pGaN) layer, and a gallium nitride (GaN) heterojunction structure under the pGaN layer. The GaN heterojunction layer includes a barrier layer and a channel layer, e.g., an aluminum gallium nitride (AlGaN) barrier layer and a GaN channel layer under the AlGaN barrier layer. The NTC resistor also includes an isolation region extending across an interface of the barrier layer and the channel layer, and a first metal electrode on the pGaN layer spaced from a second metal electrode on the pGaN layer. The NTC resistor can be used as a temperature compensated reference in a structure providing a temperature detection circuit. The temperature detection circuit includes an enhancement mode high electron mobility transistor (EM HEMT) sharing layers with the NTC resistor and includes two temperature independent current sources including depletion mode HEMTs (DM HEMTs).

FIG. 1 shows a cross-sectional view of a structure 100 including a negative temperature coefficient (NTC) resistor 102 in a gallium nitride (GaN) technology setting, i.e., for an III-V integrated circuit, according to embodiments of the disclosure. NTC resistor 102 may be used in any III-V integrated circuit structure in which a negative temperature coefficient resistor finds application. As used herein, "negative temperature coefficient" means the resistor has decreasing resistance with increasing temperature, i.e., temperature and resistance are oppositely (negatively) correlated. Structure 100 and NTC resistor 102 can be formed on a III-V semiconductor substrate, e.g., a gallium nitride (GaN) heterojunction structure including a barrier layer and a channel layer. More particularly, structure 100 and NTC resistor 102 can include multiple epitaxially grown semiconductor layers on a semiconductor substrate 114. Semiconductor substrate 114 can be, for example, a silicon or silicon-based substrate (e.g., a silicon carbide (SiC) substrate), a sapphire substrate, a III-V semiconductor substrate (e.g., a gallium nitride (GaN) substrate or some other suitable III-V semiconductor substrate), a silicon substrate (perhaps doped p-type), or any other suitable substrate for a III-V semiconductor device. Epitaxially grown semiconductor layers on substrate 114 can include, for example: an optional buffer layer 116 on the top surface of semiconductor substrate 114; a channel layer 118 on buffer layer 116; and a barrier layer 120 on channel layer 118. These epitaxial grown semiconductor layers can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP).

Optional buffer layer 116 can be employed to facilitate growth of channel layer 118 and to provide for lattice constants of substrate 114 below and channel layer 118 above. Buffer layer 116 can be doped or undoped. Optionally, buffer layer 116 can be carbon-doped. Barrier layer 120 can have a band gap that is wider than the bandgap of channel layer 118 for the device channel. Those skilled in the art will recognize that the barrier and channel materials can be selected so that a heterojunction is formed at the interface between the two layers, thereby forming a two-dimensional electron gas (2DEG) region 128 in channel layer 118 (see dashed box). The 2DEG region 128 in channel layer 118 can provide the conductive pathway for the drifting of charges between the source and the drain suitable for use in a HEMT or, in a more particular example, a metal-insulator-semiconductor HEMT (MISHEMT). Collectively, barrier layer 118 and channel layer 120 form a gallium nitride (GaN) heterojunction structure 121 (FIGS. 1-2 only), i.e., GaN heterojunction structure 121 includes barrier layer 118 and channel layer 120.

In some embodiments, buffer layer 116 could be a carbon-doped gallium nitride (C-GaN) buffer layer or a buffer layer of any other material suitable for use as a buffer layer of a HEMT or MISHEMT. Channel layer 118 could be a gallium nitride (GaN) layer or a III-V semiconductor channel layer made of any other III-V semiconductor compound suitable for use as a channel layer in a HEMT or MISHEMT. Barrier layer 120 could be an aluminum gallium nitride (AlGaN) barrier layer or a barrier layer of any other material suitable for use as a barrier layer in a HEMT or MISHEMT. In certain embodiments, barrier layer 120 includes aluminum gallium nitride (AlGaN) having an aluminum (Al) mole fraction between 15-25%. In one non-limiting example, barrier layer 120 may have thickness of between 15 and 20 nanometers. For purposes of illustration, the figures and the description depict the epitaxially grown layers (e.g., buffer layer 116; channel layer 118; and barrier layer 120) as being single layered structures (i.e., comprising one layer of buffer material, one layer of channel material and one layer of barrier material). It should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

One or more passivation layers (not shown in FIGS. 1, 2, see FIGS. 4-5) may be over barrier layer 120, e.g., where MISHEMTs are being used. Passivation layers, where provided, may include one or more layers of any appropriate passivation material such as but not limited to aluminum oxide ($Al_2O_3$), silicon nitride ($Si_3N_4$) and/or silicon oxide ($SiO_x$). As will be recognized by those with skill in the art, GaN heterojunction structure 121 (FIGS. 1-2) may include other layers, not shown.

NTC resistor 102 includes a p-type doped gallium nitride (pGaN) layer 130. pGaN layer 130 may include, for example, p-type doped gallium nitride. pGaN layer 130 is crystalline. The p-type dopant may include any appropriate p-type dopant for GaN such as but not limited to magnesium, zinc, cadmium and carbon. GaN heterojunction structure 121 is under pGaN layer 130. That is, barrier layer 120 is under pGaN layer 130, and channel layer 118 is under barrier layer 120.

Figure 2:
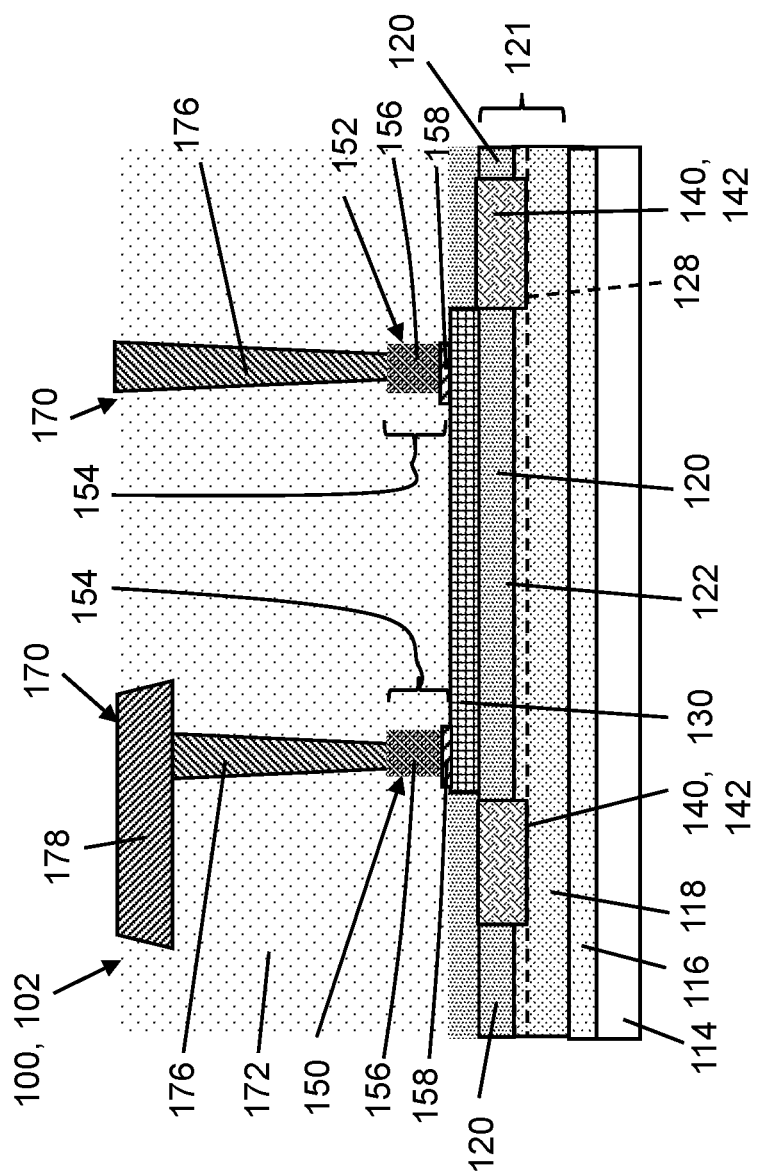
FIG. 2 shows a cross-sectional view of a structure including an NTC resistor in GaN technology setting, according to additional embodiments of the disclosure.

Structure 100 and NTC resistor 102 also include an isolation region 140 extending across an interface of barrier layer 120 and channel layer 118, i.e., to interrupt 2DEG region 128. Isolation region 140 includes an amorphizing dopant species including at least one of argon (Ar) and nitrogen (N). Isolation region 140 may be doped with the amorphizing dopant species in any manner. For example, isolation region 140 may be doped using in-situ doping during selective epitaxial growth thereof apart from epitaxial growth of barrier layer 120, or it may be doped by ion implantation directed by a mask after epitaxial growth of barrier layer 120. Isolation region 140 has a dopant concentration sufficient to make it electrically non-conducting. In certain embodiments, as shown in FIG. 1, isolation region 140 is directly under pGaN layer 130. In this case, isolation region 140 is surrounded by barrier layer 120. FIG. 2 shows a cross-sectional view of structure 100 including NTC resistor 102, according to additional embodiments of the disclosure. In contrast to FIG. 1, in FIG. 2, barrier layer 120 includes a portion 122 directly under pGaN layer 130 of NTC resistor 102, and isolation region 140 surrounds portion 122 of barrier layer 120. In FIG. 2, isolation region 140 is shown cross-sectionally as isolation region portions 142 on either side of portion 122 of barrier layer 120. It is understood, however, that isolation region 140 surrounds portion 122 of barrier layer 120 in this embodiment. Portions 142 extend across the interface between barrier layer 120 and channel layer 118, i.e., interrupting 2DEG region 128.

Referring to both FIGS. 1 and 2, structure 100 and NTC resistor 102 also include a first metal electrode 150 on pGaN layer 130 spaced from a second metal electrode 152 on pGaN layer 130. Metal electrodes 150, 152, as will be described further, may include the same materials as parts of HEMTs or MISHEMTs formed in the same layers. First and second metal electrodes 150, 152 may include multiple layers. For example, first and second metal electrode 150, 152 may include a metallic layer 154, including one or more metallic layers. Metallic layer 154 may include, for example, a metal or metal alloy 156 such as but not limited to titanium aluminum or titanium nitride, and an ohmic contact 158 including a metal or metal alloy such as titanium nitride (TiN) or any other appropriate ohmic contact material.

The resistance of NTC resistor 102 is generally linear relative to temperature and is not reliant on any back-bias. The resistance characteristics of NTC resistor 102, including its initial resistance and its operational characteristics relative to changes in temperature, can be user-set by adjusting various factors. The factors may include but are not limited to any one or more of the factors listed hereafter. A length of pGaN layer 130 and either the length of isolation region 140 thereunder in the FIG. 1 embodiment or the length of portion 122 of barrier layer 120 and length of isolation region 140 (or portions 142 thereof) in the FIG. 2 embodiment; a distance between first and second metal electrodes 150, 152; thickness of pGaN layer 130; thickness of isolation region 140 and/or barrier layer 120; thickness and materials of metal electrodes 150, 152; arrangement of isolation region (e.g., FIG. 1 or 2 embodiment); dopant and/or dopant concentration of pGaN layer 130; and/or dopant and/or dopant concentration of isolation region 140.

Structure 100 and NTC resistor 102 may include a variety of interconnects 170 depending on the application thereof. Interconnects 170 can be provided in any middle-of-line and/or back-end-of-line interlayer dielectric (ILD) layers 172 using known techniques. While one ILD layer 172 is shown, it will be recognized by those with skill in the art that more than one ILD layer may be provided. Interconnects 170 may include any required contacts or vias (collectively "contacts" hereafter) 176 and metal wires 178. Each contact 176 may include any currently known or later developed conductive material configured for use in an electrical contact, e.g., tungsten (W). Contacts 176 may additionally include refractory metal liners (not shown) positioned alongside ILD layer 172 to prevent electromigration degradation, shorting to other components, etc. Metal wires 178 may include any appropriate conductors such as aluminum or copper. Metal wires 178 may also include refractory metal liners (not shown) positioned alongside ILD layer 172 to prevent electromigration degradation, shorting to other components, etc. Additionally, selected portions of active semiconductor materials may include silicide regions (i.e., portions of semiconductor that are annealed in the presence of an overlying conductor to increase the electrical conductivity of semiconductor regions) (not shown) to increase the electrical conductivity at their physical interface with contact(s) 176 and/or metal wires 178 where applicable.

Figure 3:
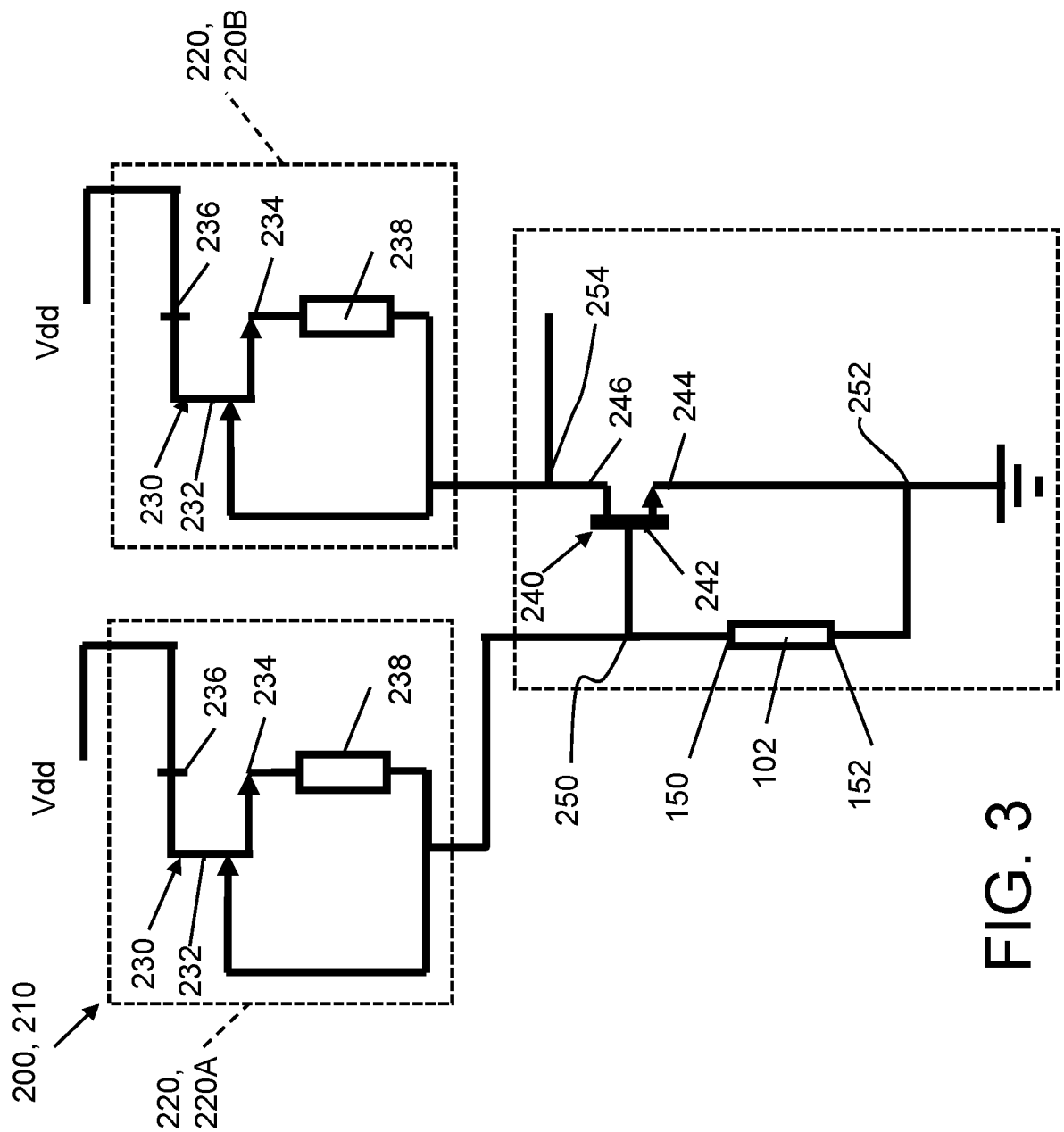
FIG. 3 shows a schematic view of a structure including a temperature detection circuit including an NTC resistor and two temperature independent current sources, according to embodiments of the disclosure.
Figure 4:
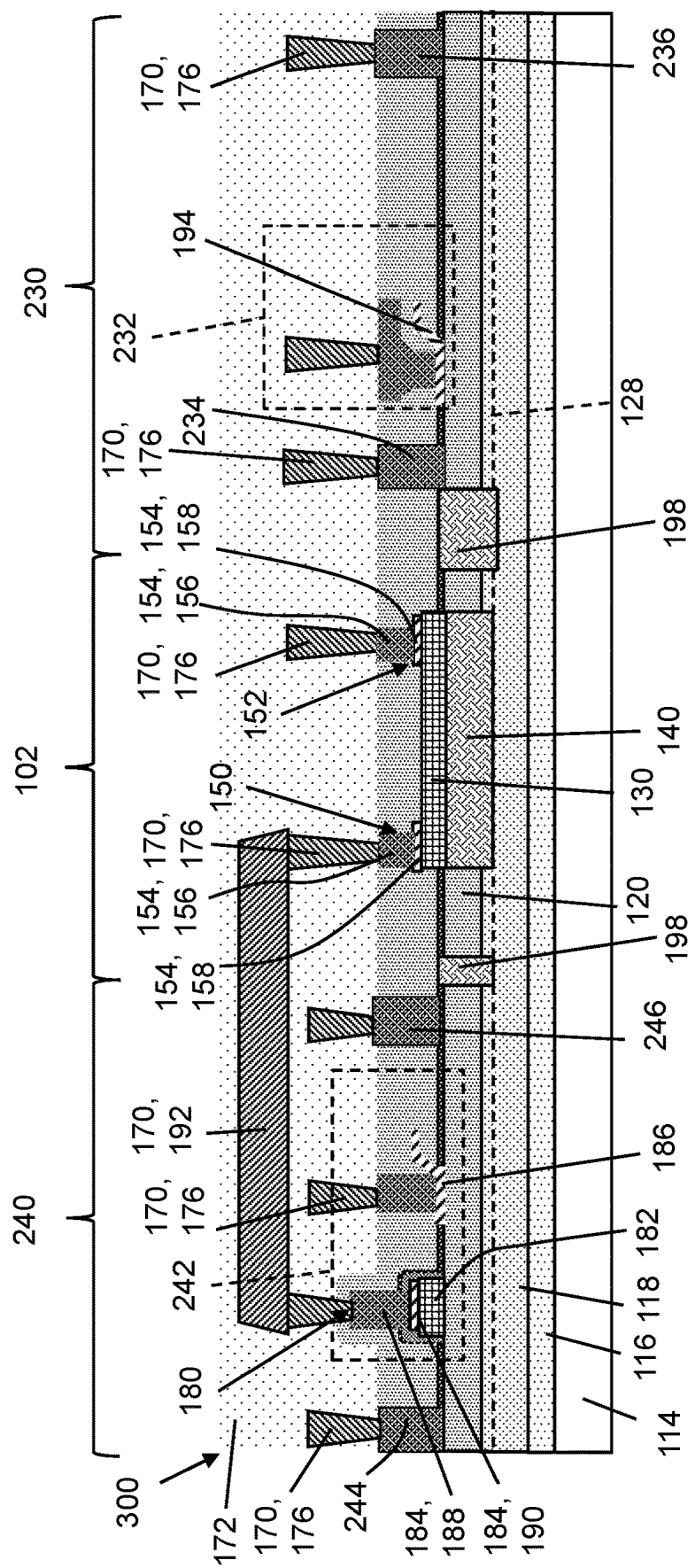
FIG. 4 shows a cross-sectional view of a structure including parts of the temperature detection circuit and the NTC resistor of FIG. 1, according to embodiments of the disclosure.
Figure 5:
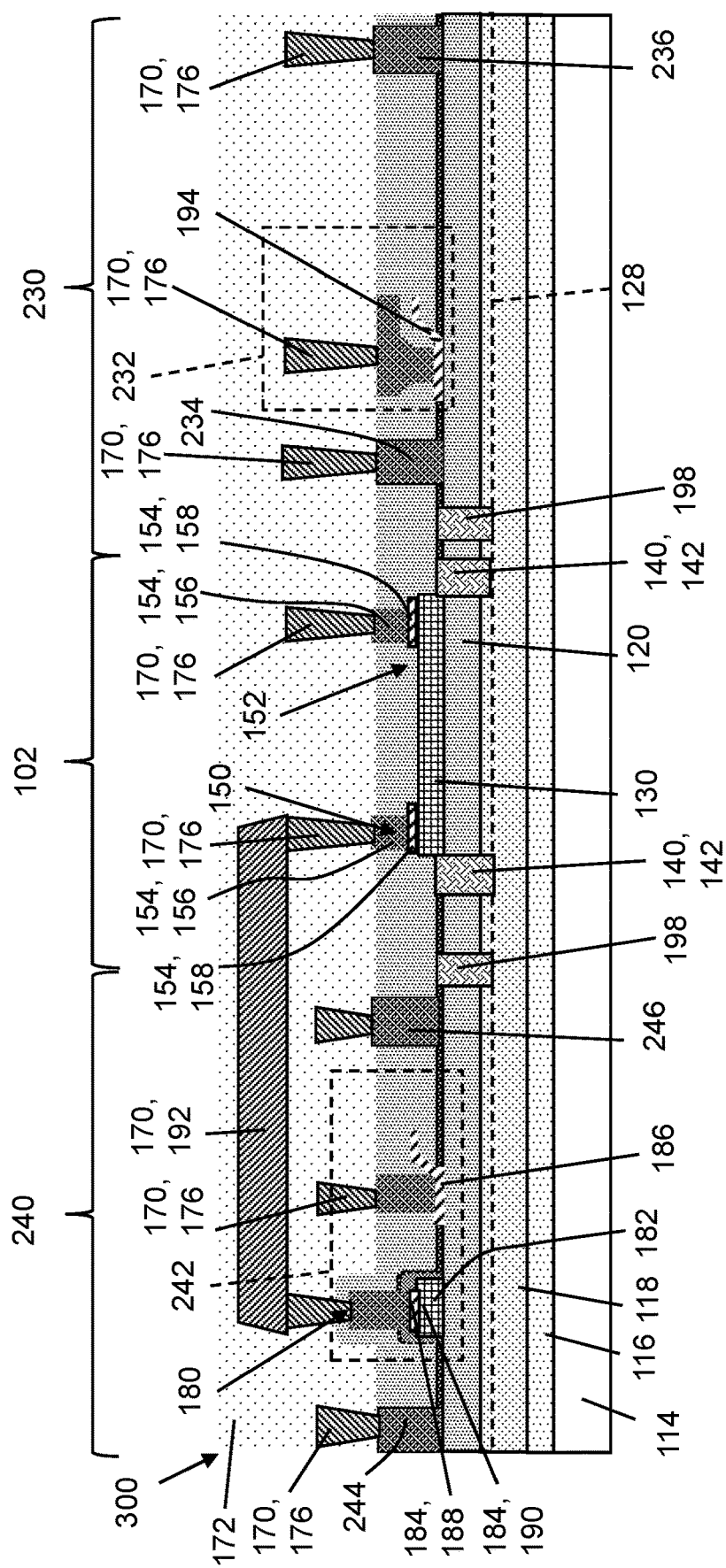
FIG. 5 shows a cross-sectional view of a structure including parts of the temperature detection circuit and the NTC resistor of FIG. 2, according to additional embodiments of the disclosure.

FIG. 3 shows a schematic view of a structure 200 including a temperature detection circuit 210 (hereinafter "TD circuit 210") including NTC resistor 102, according to embodiments of the disclosure. FIGS. 4 and 5 show cross-sectional views of part of structure 200 (e.g., excluding ZTC resistors 238) exhibiting how TD circuit 210 including NTC resistor 102 can be formed in a single GaN heterojunction structure 121 (FIGS. 1-2) (e.g., AlGaN/GaN) similar to that shown for NTC resistor 102 in the FIGS. 1 and 2 embodiments, respectively. As will be described, NTC resistor 102 is part of TD circuit 210 and may share layers of HEMTs thereof.

As shown in FIG. 3, structure 200 and TD circuit 210 include a first temperature independent current source 220A and a second temperature independent current source 220B (collectively "current sources 220"). Current sources 220 may include any now known or later developed temperature independent current source usable in GaN technology setting. In certain embodiments, first temperature independent current source 220A and second temperature independent current source 220B each include a depletion mode HEMT (DM HEMT) 230 having a gate 232, a first source/drain region 234 and a second source/drain region 236. "Depletion mode" indicates DM HEMT 230 is typically in an on-state and requires a negative voltage (referred to as a "pinch-off voltage") to be applied to a gate thereof to turn it off, i.e., to deplete electron flow through 2DEG region 128 (FIGS. 1-2, 4-5) in channel layer 118. Current sources 220 also include a zero-temperature coefficient (ZTC) resistor 238 coupled between first source/drain region 234 and gate 232 of DM HEMT 230. Second source/drain region 236 of DM HEMTs 230 are coupled to a voltage source (Vdd). Although two voltage sources Vdd are shown, they may be the same. ZTC resistor 238 can include any now known or later developed resistor that exhibits no (or very little) change in resistance with change in temperature. In one example, ZTC resistor 238 may include a silicon-chromium resistor. Other forms of ZTC resistors are also possible. ZTC resistor 238 can be formed in any middle-of-line or back-end-of-line interconnect layer. The parts of independent constant current sources 220A, 220B are substantially identical so they operate in an identical manner. Notably, temperature independent constant current sources 220A, 220B provide an identical current regardless of temperature, i.e., I=Vpinch/R, where I is the current, Vpinch is pinch off voltage of each DM HEMT 230, and R is the resistance of each ZTC resistor 238.

Structure 200 and TD circuit 210 also include an enhancement mode high electron mobility transistor (EM HEMT) 240 having a gate 242, a first source/drain region 244 and a second source/drain region 246. "Enhancement mode" indicates EM HEMT 240 is typically in an off-state and requires a positive voltage (referred to as a "threshold voltage") to be applied to a gate thereof to turn it on, i.e., enhance/allow electron flow through 2DEG region 128 (FIGS. 1-2, 4-5) and channel layer 118. In the examples shown, respective first source/drain regions 234, 244 of HEMTs 230, 240 are illustrated as sources, and respective second source/drain regions 236, 246 of HEMT 230, 240 are illustrated as drains. While HEMTs 230, 240 are described generically herein as HEMTs, it will be recognized that they may also be implemented as MISHEMTs, where desired, i.e., with passivation layers between gates thereof of barrier layer 120.

Structure 200 and TD circuit 210 also include a first node 250 coupling first temperature independent current source 220A (e.g., between ZTC resistor 238 and gate 232 of DM HEMT 230), first metal electrode 150 of NTC resistor 102 and gate 242 of EM HEMT 240. A second node 252 couples first source/drain region 244 of EM HEMT 240 and second metal electrode 152 of NTC resistor 102 to ground. An output node 254 couples second source/drain region 246 of EM HEMT 240 and second temperature independent current source 220B (e.g., between ZTC resistor 238 and gate 232 of DM HEMT 230). It will be recognized that the particular metal electrode 150, 152 coupled to the indicated nodes may be switched without change in function of NTC resistor 102.

TD circuit 210 can operate to detect temperature increasing over a threshold or decreasing below a threshold based on a resulting voltage change at gate 242 of EM HEMT 240 caused by changing resistance of NTC resistor 102. That is, when a temperature crosses a threshold, a voltage change at NTC resistor 102 and at gate 242 of EM HEMT 240 caused by a change in resistance of NTC resistor 102 causes the EM HEMT to change states. More particularly, voltage at gate 242 of EM HEMT 240 is controlled by current from first temperature independent current source 220A and the temperature dependent resistance of NTC resistor 102. Since the current from temperature independent current source 220A does not change, the temperature compensated (i.e., dependent) resistance of NTC resistor 102 controls the voltage at gate 242 of EM HEMT 240. Second source/drain region 246 of EM HEMT 240 is coupled to second temperature independent current source 220B, and thus observes the same current as gate 242 of EM HEMT 240. First source/drain region 244 of EM HEMT 240 and second metal electrode 152 of NTC resistor 102 are grounded, i.e., 0 V.

In terms of increasing temperature detection, EM HEMT 240 may have a threshold voltage set sufficiently high to maintain the transistor in an 'ON' (or high) state. As temperature increases in structure 200, the resistance of NTC resistor 102 and the voltage at gate 242 of EM HEMT 240 decrease. When the temperature in structure 200 crosses a threshold, a voltage change at NTC resistor 102 and at gate 242 of EM HEMT 240 causes the EM HEMT to change states. For example, when temperature increases above a desired threshold, the voltage at gate 242 becomes lower than the threshold voltage of EM HEMT 240, switching it from an 'ON' (or high) state to an 'OFF' (or low) state, changing the state at output node 254. That is, in response to a temperature increase past a threshold, a voltage decrease across NTC resistor 102 and at gate 242 of EM HEMT 240 causes EM HEMT 240 to change states, indicating the presence of the higher temperature.

In terms of decreasing temperature detection, EM HEMT 240 may have a threshold voltage set sufficiently low to maintain the transistor in an 'OFF' (or low) state. As temperature decreases in structure 200, the resistance of NTC resistor 102 and the voltage at gate 242 of EM HEMT 240 increase. When the temperature decreases below a desired threshold, the voltage at gate 242 becomes higher than the threshold voltage of EM HEMT 240, switching it from an 'OFF' (or low) state to an 'ON' (or high) state, changing the state at output node 254. That is, in response to a temperature decrease past a threshold, a voltage increase across NTC resistor 102 and at gate 242 of EM HEMT 240 causes EM HEMT 240 to change states, indicating the presence of the low temperature.

Regardless of the form of temperature detection, a switching of the state at output node 254 may cause some form of remedial action in any now known or later developed manner, e.g., activating additional circuitry to turn off of certain structures, turning off a particular transistor gate to prevent thermal runaway, turn on of duplicative structures, or any other action typically taken in response to an undesirably hot or cold temperature, within an integrated circuit. The temperature threshold can be set by changing the operational characteristics of NTC resistor 102, as previously described herein.

As shown in FIGS. 4-5, NTC resistor 102 and EM HEMT 240 may share layers. Further, parts of temperature independent constant current sources 220A, 220B (for example, DM HEMTs 230 thereof) may share layers with NTC resistor 102 and EM HEMT 240 within a single GaN heterojunction structure 121 (FIGS. 1-2). For clarity of illustration, only select interconnects 170 are shown between devices. Further, only one DM HEMT 230 of current sources 220 is shown in FIGS. 4-5, but it will be recognized that they can be duplicated in another region of GaN heterojunction structure 121 (FIGS. 1-2). FIG. 4 shows a cross-sectional view of a structure 300 including NTC resistor 102 according to the FIG. 1 embodiment, and FIG. 5 shows a cross-sectional view of structure 300 including NTC resistor 102 according to the FIG. 2 embodiment.

As shown in FIGS. 4 and 5, EM HEMT 240 includes first source/drain region 244 (e.g., source) and second source/drain 246 (e.g., drain). In addition, EM HEMT 240 includes gate 242 including a gallium nitride (GaN) gate 180 including a p-type GaN (pGaN) layer 182 underneath a metallic layer 184. GaN gate 180 may also be referenced herein as a "pGaN gate." Metallic layer 184 may include a number of layers such as a metal or metal alloy 188 such as but not limited to titanium aluminum or titanium nitride, and an ohmic contact 190 such as titanium nitride (TiN) or any other appropriate ohmic contact material. Gate 242 may also optionally include a field plate gate 186 between source/drain regions 244, 246. As shown, field plate gate 186 is closer to source/drain region 246 than GaN gate 180. Although not shown, field plate gate 186 may be coupled to first source/drain region 244 (source). Other forms of EM HEMT 240 are also possible.

As illustrated, pGaN layer 130 of NTC resistor 102, barrier layer 120 of NTC resistor 102, and channel layer 120 of NTC resistor 102 are shared with EM HEMT 240. First and second metal electrodes 150, 152 of NTC resistor 102 are also adjacent EM HEMT 240 and may share layers. For example, metallic layer 184 of gate 242 of EM HEMT 240 and metallic layer 154 of first and second metal electrodes 150, 152 of NTC resistor 102 may be the same layers. For example, metallic layer 154, 184 may include metal or metal alloy 156, 188 such as but not limited to titanium aluminum or titanium nitride, and ohmic contact 158, 190 such as titanium nitride (TiN) or any other appropriate ohmic contact material. FIG. 4 shows one metal wire 192 coupling first metal electrode 150 and gate 242 of EM HEMT 240, as schematically illustrated in FIG. 3. In this manner, first metal electrode 150 and pGaN layer 130 of NTC resistor 102 form part of gate 242 of EM HEMT 240. Because pGaN layers 130, 182 are the same, the threshold voltage of EM HEMT 240 has a positive temperature coefficient that correlates with the negative temperature coefficient of the resistance of NTC resistor 102. That is, the increases/decreases of the threshold voltage of EM HEMT 240 and the resistance of NTC resistor 102 change in the same proportions. Hence, the threshold voltage of EM HEMT 240 is proportional to absolute temperature (PTAT) based on the resistance of NTC resistor 102.

DM HEMTs 230 may also be formed on the same substrate as NTC resistor 102 and EM HEMT 240. DM HEMTs 230 include first source/drain region 234 (e.g., source) and second source/drain region 236 (e.g., drain) and gate 232. DM HEMT 230 may also optionally include gate 232 in the form of a field plate gate 194. First and second source/drain regions 234, 236 of DM HEMT 230 may be the same layers first and second source/drain regions 244, 246 of EM HEMT 240. Field plate gates 186, 194 may also share layers.

Structure 300 may include a variety of interconnects depending on the application thereof. For example, interconnects can be arranged to form structure 200 and TD circuit 210 as shown in FIG. 3. For clarity, interconnects other than contacts 176 and metal wire 192 are not shown in FIGS. 4-5. Interconnects 170 can be provided in any middle-of-line and/or back-end-of-line interlayer dielectric (ILD) layers 172 using known techniques. While one ILD layer 172 is shown, it will be recognized by those with skill in the art that more than one ILD layer may be provided. Interconnects may include any required contacts or vias 176 and metal wires 178 (FIGS. 1-2), 192, as previously described herein.

Figure 6:
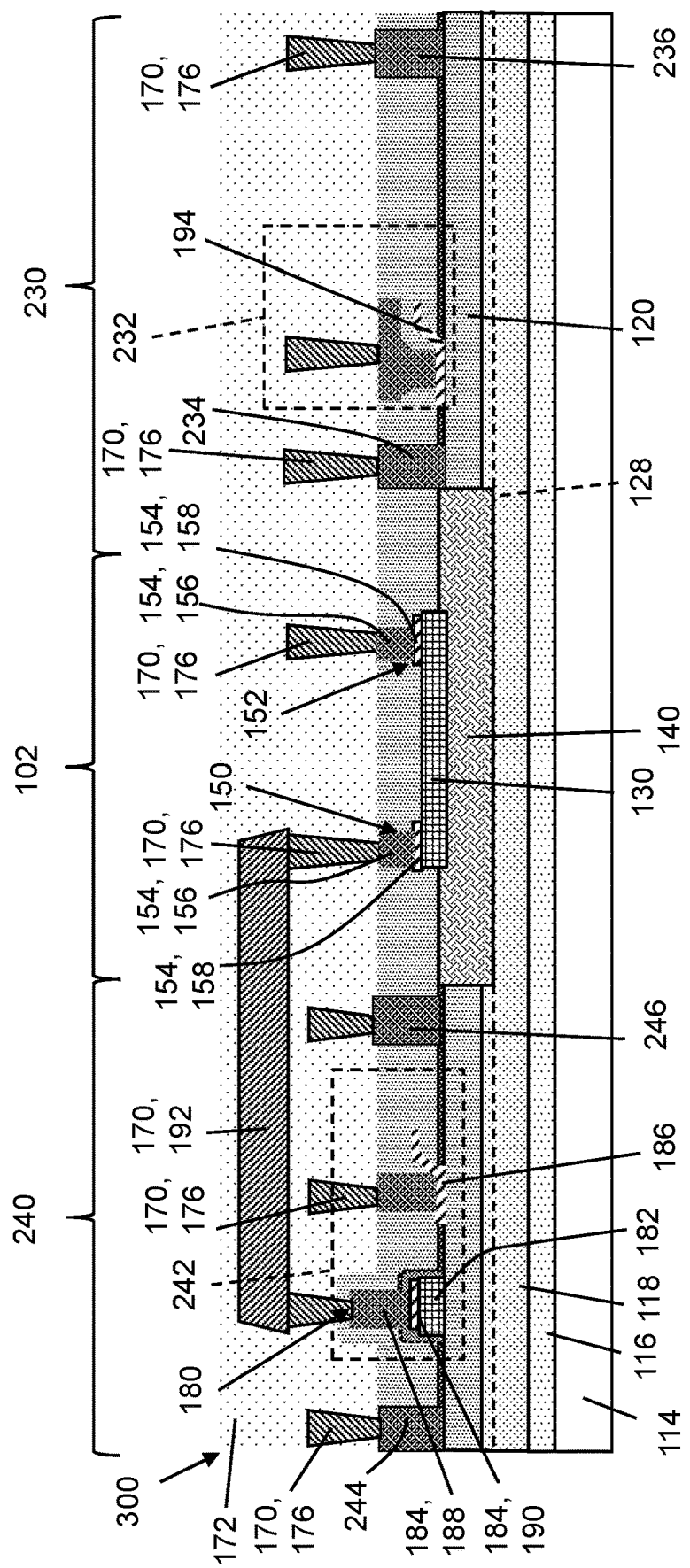
FIG. 6 shows a cross-sectional view of a structure including parts of the temperature detection circuit and the NTC resistor of FIG. 1, according to alternative embodiments of the disclosure.
Figure 7:
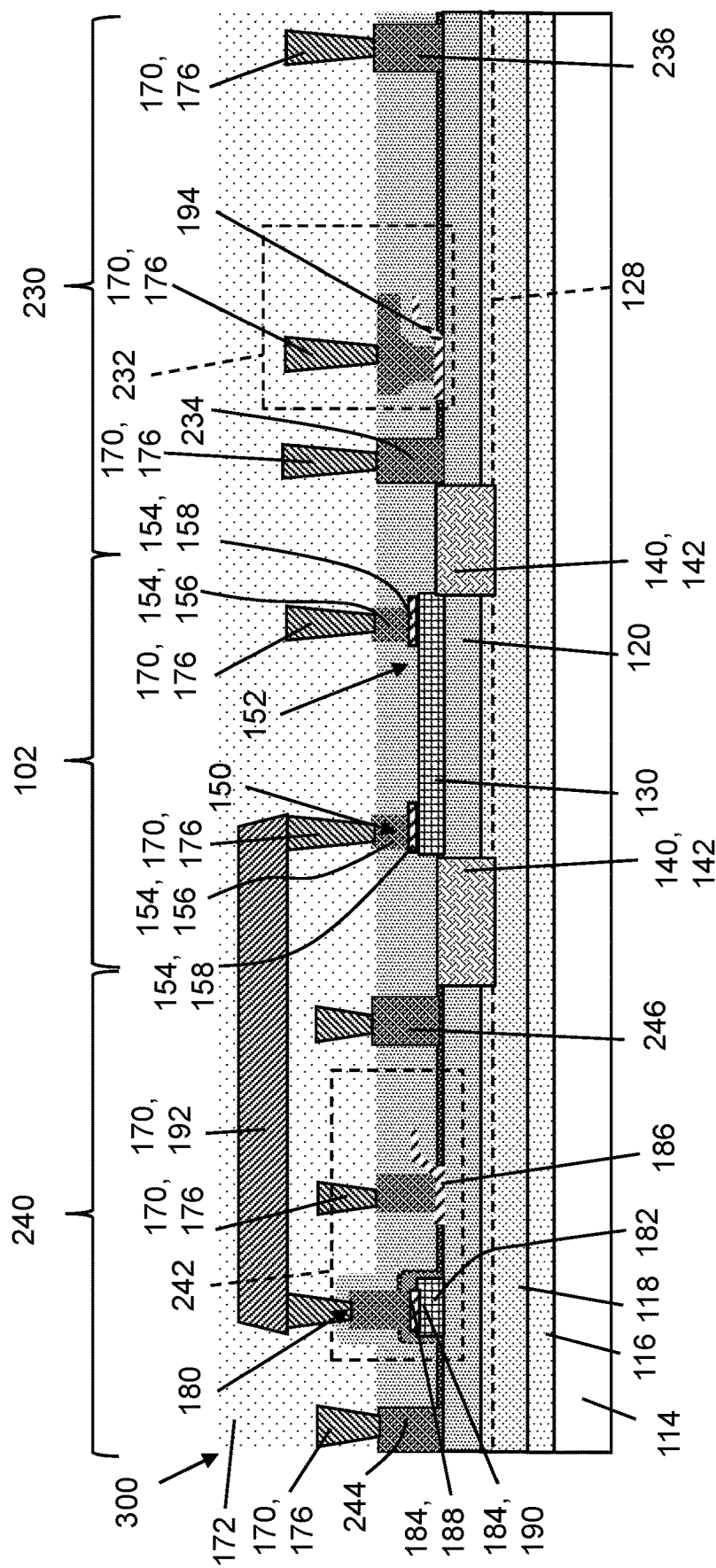
FIG. 7 shows a cross-sectional view of a structure including parts of the temperature detection circuit and the NTC resistor of FIG. 2, according to alternative embodiments of the disclosure.

Structure 300 may also include one or more isolating doping regions 198 (two shown) in one or more locations to isolated parts of structure 300. Isolating doping regions 198 may include any dopant capable of causing an electrical break in 2DEG region 128. For example, the dopants may include nitrogen and/or argon (similar to isolation region 140, but deeper and across 2DEG region 128). An isolating doping region 198 may be to each side of NTC resistor 102 to isolate it from other structures, e.g., semiconductor substrate 114. Other isolating doping regions 198 may be used to isolate parts of HEMTs 230, 240. Isolation doping regions 198 may be doped in any manner, e.g., ion implanting using masks or other structures to guide the implantation. In alternative embodiments, isolation region 140 (or portions 142 thereof) may be one with isolating doping region(s) 198. FIG. 6 shows a cross-sectional view of a structure including parts of the temperature detection circuit and the NTC resistor of FIG. 1, similar to that of FIG. 4. In FIG. 6, isolation region 140 and isolating doping regions 198 (FIG. 4) are merged into a single region (labeled 140). FIG. 7 shows a cross-sectional view of a structure including parts of the temperature detection circuit and the NTC resistor of FIG. 2, similar to FIG. 5. In FIG. 7, portions 142 (FIG. 5) of isolation region 140 and isolating doping regions 198 (FIG. 5) are merged into a single region (labeled 140, 142).

Embodiments of the disclosure provide various technical and commercial advantages, examples of which are discussed herein. Structure 100, 200, 300 provide a negative temperature coefficient resistor in a gallium nitride high electron mobility transistor setting. In one application, the NTC resistor can be used in a temperature detection circuit including a temperature independent voltage reference created by a DM HEMT which is compared to a temperature dependent voltage reference created by an EM HEMT and the NTC resistor. The NTC resistor provides a linear resistor within a GaN technology setting with no back-bias dependence. The NTC resistor is isolated so it can be used with high voltage compared to 2DEG resistors that have poor isolation to the substrate.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
    a negative temperature coefficient (NTC) resistor including:
        a p-type doped gallium nitride (pGaN) layer;
        a gallium nitride (GaN) heterojunction structure under the pGaN layer, the GaN heterojunction structure including a barrier layer and a channel layer;
        an isolation region extending across an interface of the barrier layer and the channel layer; and
        a first metal electrode on the pGaN layer spaced from a second metal electrode on the pGaN layer.

2. The structure of claim 1, wherein the barrier layer includes aluminum gallium nitride (AlGaN) having an aluminum (Al) mole fraction between 15-25%.

3. The structure of claim 1, wherein the pGaN layer and the first and second metal electrodes are adjacent a high electron mobility transistor (HEMT).

4. The structure of claim 3, wherein the first metal electrode and the pGaN layer form part of a gate of the HEMT structure.

5. The structure of claim 1, wherein the isolation region includes an amorphizing dopant species including at least one of argon and nitrogen.

6. The structure of claim 1, wherein the isolation region is directly under the pGaN layer.

7. The structure of claim 1, wherein the barrier layer includes a portion directly under the pGaN layer, and the isolation region surrounds the portion of the barrier layer.

8. The structure of claim 1, wherein the NTC resistor is part of a temperature detection circuit including:
    a first temperature independent current source;
    a second temperature independent current source;
    an enhancement mode high electron mobility transistor (EM HEMT) having a gate, a first source/drain region and a second source/drain region;
    a first node coupling the first temperature independent current source, the first metal electrode of the NTC resistor and the gate of the EM HEMT;
    a second node coupling the first source/drain region of the EM HEMT and the second metal electrode of the NTC resistor to ground; and
    an output node coupling the second source/drain region of the EM HEMT and the second temperature independent current source,
    wherein in response to a temperature crossing a threshold, a voltage change at the NTC resistor and at the gate of EM HEMT causes the EM HEMT to change states.

9. The structure of claim 8, wherein the first temperature independent current source and the second temperature independent current source each include a depletion mode HEMT (DM HEMT) having a gate, a first source/drain region and a second source/drain region, and a zero-temperature coefficient (ZTC) resistor coupled between the first source/drain region and the gate of the DM HEMT, wherein the second source/drain region of the DM HEMT is coupled to a voltage source.

10. The structure of claim 9, wherein the ZTC resistor includes a silicon-chromium resistor.

11. A structure, comprising:
    a first temperature independent current source;
    a second temperature independent current source;
    an enhancement mode high electron mobility transistor (EM HEMT) having a gate, a first source/drain region and a second source/drain region;
    a negative temperature coefficient (NTC) resistor including a first metal electrode and a second metal electrode;
    a first node coupling the first temperature independent current source, the first metal electrode of the NTC resistor and the gate of the EM HEMT;
    a second node coupling the first source/drain region of the EM HEMT and the second metal electrode of the NTC resistor to ground; and
    an output node coupling the second source/drain region of the EM HEMT and the second temperature independent current source.

12. The structure of claim 11, wherein in response to a temperature crossing a threshold, a voltage change at the NTC resistor and at the gate of EM HEMT causes the EM HEMT to change states.

13. The structure of claim 11, wherein the first temperature independent current source and the second temperature independent current source each include a depletion mode HEMT (DM HEMT) having a gate, a first source/drain region and a second source/drain region, and a zero-temperature coefficient (ZTC) resistor coupled between the first source/drain region and the gate of the DM HEMT, wherein the second source/drain region of the DM HEMT is coupled to a voltage source.

14. The structure of claim 11, wherein the NTC resistor includes:
- a p-type doped gallium nitride (pGaN) layer;
- a gallium nitride (GaN) heterojunction structure under the pGaN layer, the GaN heterojunction structure including a barrier layer and a channel layer;
- an isolation region extending across an interface of the barrier layer and the channel layer; and
- at least two spaced-apart metallic electrodes on the pGaN layer.

15. The structure of claim 14, wherein the pGaN layer, the barrier layer, and the channel layer are shared with the EM HEMT.

16. The structure of claim 14, wherein the barrier layer includes aluminum gallium nitride (AlGaN) having an aluminum (Al) mole fraction between 15-25%.

17. The structure of claim 14, wherein the isolation region includes an amorphizing dopant species including at least one of argon and nitrogen.

18. The structure of claim 14, wherein the isolation region is directly under the pGaN layer.

19. The structure of claim 14, wherein the barrier layer includes a portion directly under the pGaN layer, and the isolation region surrounds the portion of the barrier layer.

20. A structure, comprising:
- a first temperature independent current source and a second temperature independent current source, wherein the first temperature independent current source and the second temperature independent current source each include a depletion mode HEMT (DM HEMT) having a gate, a first source/drain region and a second source/drain region, and a zero-temperature coefficient (ZTC) resistor coupled between the first source/drain region and the gate of the DM HEMT, wherein the second source/drain region of the DM HEMT is coupled to a voltage source;
- an enhancement mode high electron mobility transistor (EM HEMT) having a gate, a first source/drain region and a second source/drain region;
- a negative temperature coefficient (NTC) resistor including a first metal electrode and a second metal electrode;
- a first node coupling the first temperature independent current source, the first metal electrode of the NTC resistor and the gate of the EM HEMT;
- a second node coupling the first source/drain region of the EM HEMT and the second metal electrode of the NTC resistor to ground; and
- an output node coupling the second source/drain region of the EM HEMT and the second temperature independent current source,
- wherein in response to a temperature crossing a threshold, a voltage change at the NTC resistor and at the gate of EM HEMT causes the EM HEMT to change states.

21. A negative temperature coefficient (NTC) resistor, comprising:
- a p-type doped gallium nitride (pGaN) layer;
- a gallium nitride (GaN) heterojunction structure under the pGaN layer, the GaN heterojunction structure including a barrier layer and a channel layer;
- an isolation region extending across an interface of the barrier layer and the channel layer; and
- a first metal electrode on the pGaN layer spaced from a second metal electrode on the pGaN layer.

* * * * *